(12) United States Patent
Matsuoka et al.

(10) Patent No.: US 7,898,641 B2
(45) Date of Patent: Mar. 1, 2011

(54) PRODUCTION PROCESS OF A DISPLAY DEVICE, AND A DISPLAY DEVICE

(75) Inventors: Kohji Matsuoka, Suzuka (JP); Shigeo Ikedo, Tsu (JP); Kazushige Miyamoto, Tsu (JP); Yasuyuki Ohta, Suzuka (JP)

(73) Assignee: Sharp Kabushiki Kaisha, Osaka (JP)

( * ) Notice: Subject to any disclaimer, the term of this patent is extended or adjusted under 35 U.S.C. 154(b) by 689 days.

(21) Appl. No.: 11/720,691

(22) PCT Filed: Dec. 1, 2005

(86) PCT No.: PCT/JP2005/022111

§ 371 (c)(1),
(2), (4) Date: Jul. 24, 2007

(87) PCT Pub. No.: WO2006/059693

PCT Pub. Date: Jun. 8, 2006

(65) Prior Publication Data

US 2009/0268151 A1    Oct. 29, 2009

(30) Foreign Application Priority Data

Dec. 2, 2004    (JP) ............................. 2004-349763

(51) Int. Cl.
*G02F 1/133*    (2006.01)

(52) U.S. Cl. ...................................... 349/187; 430/312

(58) Field of Classification Search ........................ None
See application file for complete search history.

(56) References Cited

U.S. PATENT DOCUMENTS

| | | | | |
|---|---|---|---|---|
| 5,656,526 A | * | 8/1997 | Inada et al. | 430/314 |
| 5,945,256 A | * | 8/1999 | Kim et al. | 430/312 |
| 6,157,433 A | * | 12/2000 | Kashimoto et al. | 349/187 |
| 6,271,904 B1 | * | 8/2001 | Liu | 349/110 |
| 2002/0036725 A1 | | 3/2002 | Takasugi et al. | |
| 2002/0039166 A1 | * | 4/2002 | Song | 349/156 |
| 2002/0063834 A1 | * | 5/2002 | Sawasaki et al. | 349/130 |

(Continued)

FOREIGN PATENT DOCUMENTS

JP    2003-322864 A    11/2003

(Continued)

OTHER PUBLICATIONS

Official Communication for PCT Application No. JP2005/022111; mailed Jan. 31, 2006.

*Primary Examiner* — Mike Stahl
(74) *Attorney, Agent, or Firm* — Keating & Bennett, LLP

(57) ABSTRACT

A production process of a display device is performed such that, even if exposure displacement is caused by an error in stitching divided regions, a linear protrusion in the vicinity of a divisional boundary is prevented from becoming thin or disappearing because of double exposure. The display device having an insulating substrate on which a plurality of dots are arranged in a matrix includes a linear protrusion which is formed on the insulating substrate by performing divisional exposure on a plurality of divided regions on the insulating substrate, wherein the boundary between the adjacent divided regions provides, in the vicinity of the linear protrusion in one of the divided regions, at least a bent portion that extends into the other divided region at a predetermined distance.

4 Claims, 9 Drawing Sheets

U.S. PATENT DOCUMENTS

2003/0174269 A1* 9/2003 Tanaka et al. ............... 349/129
2004/0183970 A1 9/2004 Niiya
2004/0207798 A1* 10/2004 Tak et al. .................... 349/187
2006/0132684 A1* 6/2006 Tanaka ........................ 349/114

FOREIGN PATENT DOCUMENTS

| | | |
|---|---|---|
| JP | 2002-107758 A | 4/2004 |
| JP | 2004-252047 A | 9/2004 |
| JP | 2004-280109 A | 10/2004 |
| JP | 2005-513529 A | 5/2005 |
| WO | 03/052501 A1 | 6/2003 |

* cited by examiner

PRODUCTION PROCESS OF A DISPLAY DEVICE, AND A DISPLAY DEVICE

BACKGROUND OF THE INVENTION

1. Field of the Invention

The present invention relates to a production process of a display device, and a display device, and specifically relates to a liquid crystal display device using a vertical alignment mode which has excellent image display quality and other advantageous properties.

2. Description of the Related Art

A liquid crystal display device is in widespread use as a display of a household electrical appliance such as a personal computer and a television set. In the liquid crystal display device, a liquid crystal panel is used. The liquid crystal panel is produced by stacking and bonding two supporting substrates via a sealing member, in which the supporting substrates are insulating substrates and patterns are formed on the supporting substrates by a predetermined method, and then by filling a space surrounded by the sealing member with liquid crystals.

For the liquid crystal display device as described above, a device using a vertical alignment mode is commercially practical, in which a liquid crystal layer possessing negative dielectric anisotropy is interposed between an opposed supporting substrate pair so that liquid crystal molecules are aligned vertically, and when a voltage is applied to the liquid crystal layer, the liquid crystal molecules are controlled to be aligned in a plurality of inclined directions relative to the supporting substrates.

In this liquid crystal display device using the vertical alignment mode, in order to improve viewing angle characteristics in display, it is effective to create a plurality of domains in one pixel for controlling the liquid crystal molecules aligned in the vertical direction to be aligned in a plurality of inclined directions that are different from one domain to another relative to the vertical direction. For this purpose, as control mechanism for liquid crystal molecule alignment for creating such domains, a linear protrusion is provided to a common electrode on the substrate at a color filter side, or an opening is provided to a pixel electrode on the substrate at an active element side.

FIG. 7 is a plan view showing linear protrusions 81 in two pixels adjacent to each other, which are formed on a substrate at a color filter side. The linear protrusion 81 is formed by deposition of materials, a photolithography process, and development. To be specific, a photosensitive organic insulating film is coated on a common electrode 85 to be subjected to a pre-baking process, followed by an exposure process. After the exposure process, the insulating film is developed with a developing solution to remove unnecessary portions, and a pattern of the linear protrusion 81 is formed as shown in FIG. 7.

In recent years, accompanied by upsizing of a screen for a liquid crystal display device used in a liquid crystal television set and the like, a manufacturing apparatus which is usable in manufacturing a large-sized screen has been required. However, concerning exposure, a conventional small-sized lithography is used in manufacturing the large-sized screen by using divisional exposure such that a screen is divided into a plurality of regions to be exposed.

A procedure for forming the above-described linear protrusion 81 by such divisional exposure is explained referring to FIGS. 7 to 9D. The chain double-dashed line in the middle of FIG. 7 indicates a boundary 80 for divisional exposure. FIGS. 8A and 8B are magnified views showing two division masks 82 and 83 used for divisional exposure in a circled portion D of FIG. 7. FIGS. 9A and 9B are sectional views showing states at a section E-E of FIGS. 7, 8A and 8B in the course of divisional exposure using the division masks 82 and 83.

First, the organic insulating film 84 that is a positive photoresist is coated on the common electrode 85 to be subjected to a pre-baking process, followed by the exposure process using the division mask 82 shown in FIG. 8A. As shown in FIG. 9A, the division mask 82 includes opaque patterns 82*a* and 82*b* for patterning linear protrusions 81*b* and 81*c* on the right side of the divisional boundary 80 and an opaque pattern 82*c* on the left side of the divisional boundary 80, and transparent patterns 82*d*, 82*e* and 82*f*. As illustrated, the transparent patterns 82*d*, 82*e* and 82*f* provide diffraction light K, which forms exposed portions 84*a*, 84*b* and 84*c* in the form of an inverted trapezoid in the organic insulating film 84.

Next, the exposure process using the division mask 83 shown in FIG. 8B is performed. As shown in FIG. 9B, the division mask 83 includes an opaque pattern 83*a* for patterning a linear protrusion 81*a* on the left side of the divisional boundary 80 and an opaque pattern 83*b* on the right side of the divisional boundary 80, and transparent patterns 83*c* and 83*d*. Also in this case, the transparent patterns 83*c* and 83*d* provide diffraction light K, which forms exposed portions 84*d* and 84*e* in the form of an inverted trapezoid in the organic insulating film 84. In this instance, a portion 84*f* at the divisional boundary 80 is double exposed.

Then, after the development with the developing solution is performed and the exposed portions are removed, the linear protrusions 81*a*, 81*b* and 81*c* are formed as shown in FIG. 9C.

As a prior art literature relating to the present invention, Japanese Patent Application Unexamined Publication No. 2003-322864 is cited.

However, since the linear protrusions 81*a* and 81*b* in the vicinity of the divisional boundary 80 are close to each other as shown in FIG. 9C, if exposure displacement is caused by an error in stitching the divided regions, the linear protrusion 81*b* in the right side is unintentionally formed to be thin as shown in FIG. 9D or disappears at worst because of the double exposure. Such thinning or disappearance of the linear protrusion 81*b* that is the control mechanism for liquid crystal molecule alignment leads to poor alignment of the liquid crystal molecules in this portion, resulting in a problem that unevenness occurs in and around the divisional boundary.

Such an error in stitching the divided regions is caused by an alignment error of the masks, a magnification error, a dimensional deviation in manufacturing the masks, or the like. However, improving accuracy thereof causes a great increase in the cost of the lithography, leading to a cost problem.

SUMMARY OF THE INVENTION

In order to overcome the problems described above, preferred embodiments of the present invention provide a production process of a display device and a display device such that even if exposure displacement is caused by an error in stitching divided regions, a linear protrusion in the vicinity of a divisional boundary is prevented from becoming thin or disappearing because of double exposure.

According to a preferred embodiment of the present invention, a production process of a display device having an insulating substrate on which a plurality of dots are formed in a matrix includes the step of forming a linear protrusion on the insulating substrate by performing divisional exposure on a plurality of divided regions on the insulating substrate, in which a boundary between the adjacent divided regions provides, in the vicinity of the linear protrusion in one of the divided regions, at least a bending portion that extends into the other divided region at a predetermined distance.

In this case, it is preferable to have a configuration in which the linear protrusion is used as control mechanism arranged to align liquid crystal molecules in a liquid crystal layer which is located on the insulating substrate. In addition, it is preferable to have a configuration in which the insulating substrate includes a color filter.

According to another preferred embodiment of the present invention, a display device having an insulating substrate on which a plurality of dots are formed in a matrix includes a linear protrusion which is formed on the insulating substrate by performing divisional exposure on a plurality of divided regions on the insulating substrate, in which a boundary between the adjacent divided regions provides, in the vicinity of the linear protrusion in one of the divided regions, at least a bending portion that extends into the other divided region at a predetermined distance.

In this case, it is preferable to have a configuration in which the linear protrusion is used as control mechanism arranged to align liquid crystal molecules in a liquid crystal layer which is located on the insulating substrate. In addition, it is preferable to have a configuration in which the insulating substrate includes a color filter.

According to the production process of the display device and the display device having the above-described configurations, by applying the configuration in which the production process includes the step of forming the linear protrusion on the insulating substrate by performing the divisional exposure on a plurality of the divided regions on the insulating substrate, in which the boundary between the adjacent divided regions provides, in the vicinity of the linear protrusion in one of the divided regions, at least the one bending portion that extends into the other divided region at the predetermined distance, the linear protrusion is prevented from becoming thin or disappearing because of the double exposure, thereby improving the display device in quality.

Especially, by applying the configuration in which the linear protrusion is used as the control mechanism arranged to align the liquid crystal molecules in the liquid crystal layer which is located on the insulating substrate, unevenness can be prevented from occurring in and around the divisional boundary because of poor alignment of the liquid crystal molecules. In addition, by applying the configuration in which the insulating substrate includes the color filter, alignment control of the liquid crystal molecules by the linear protrusion can be improved.

Other features, elements, processes, steps, characteristics and advantages of the present invention will become more apparent from the following detailed description of preferred embodiments of the present invention with reference to the attached drawings.

DETAILED DESCRIPTION OF PREFERRED EMBODIMENTS

Figure 1:
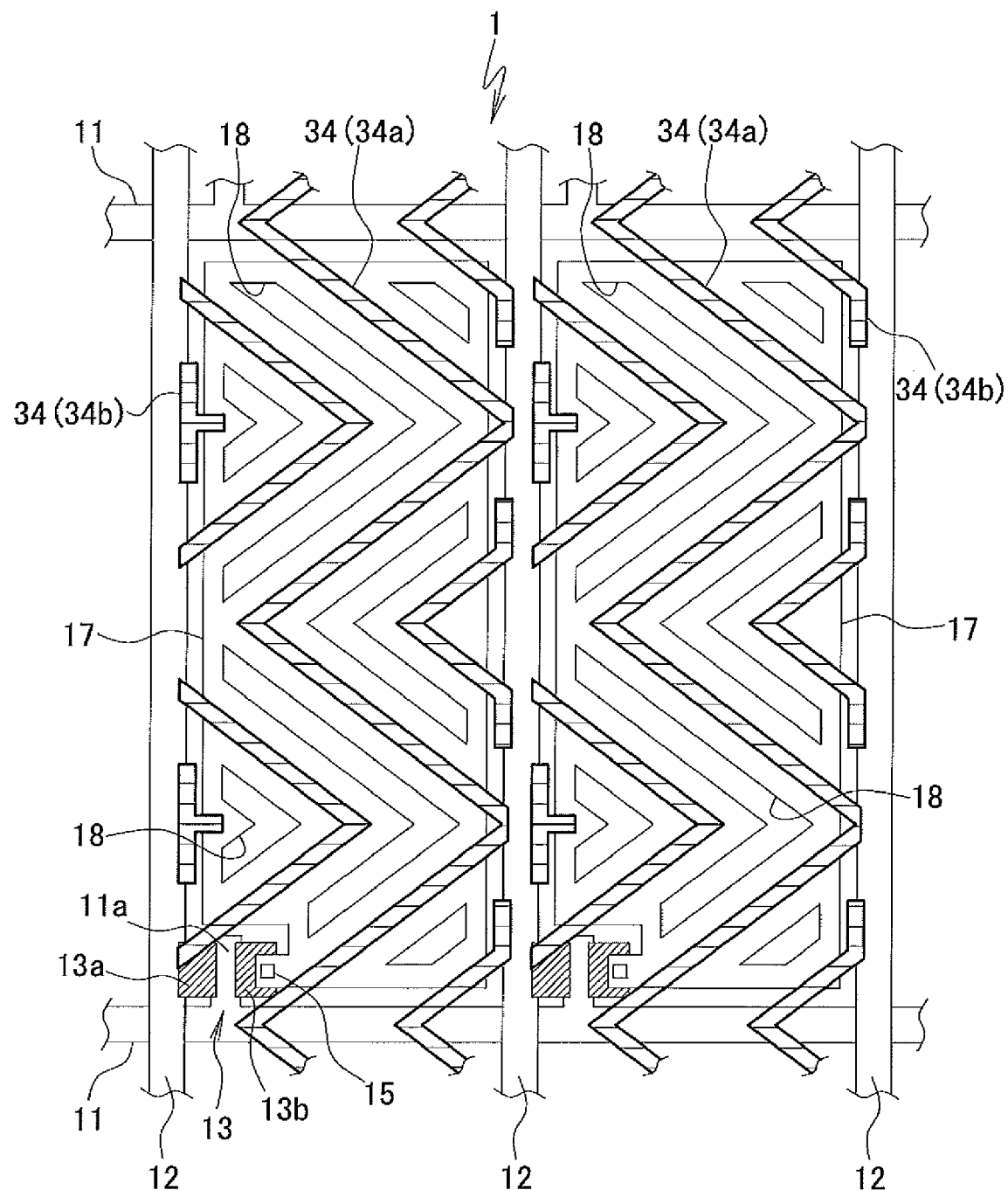
FIG. 1 is a magnified schematic plan view showing two pixels adjacent to each other in a crystal liquid display device according to a preferred embodiment of the present invention.
Figure 2:
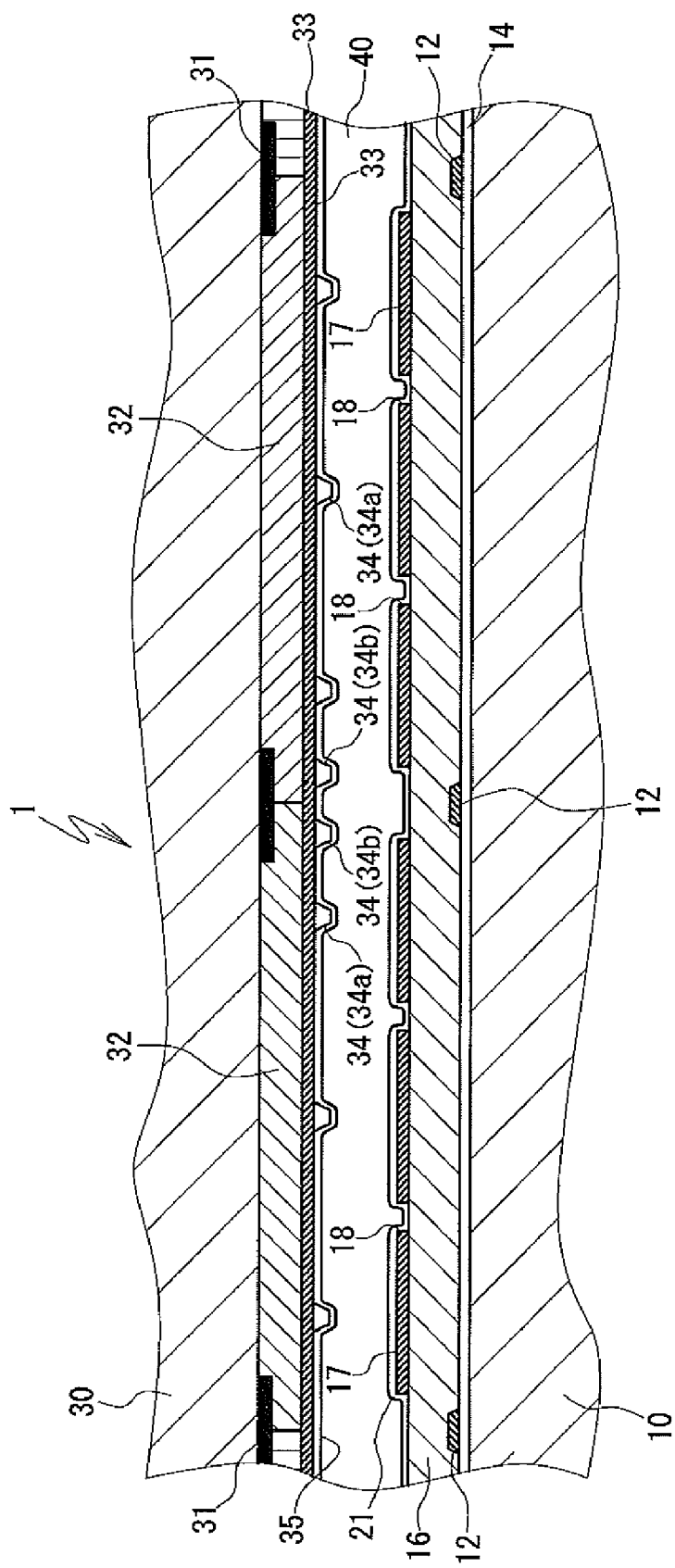
FIG. 2 is a schematic transverse sectional view of the pixels shown in FIG. 1.
Figure 3:
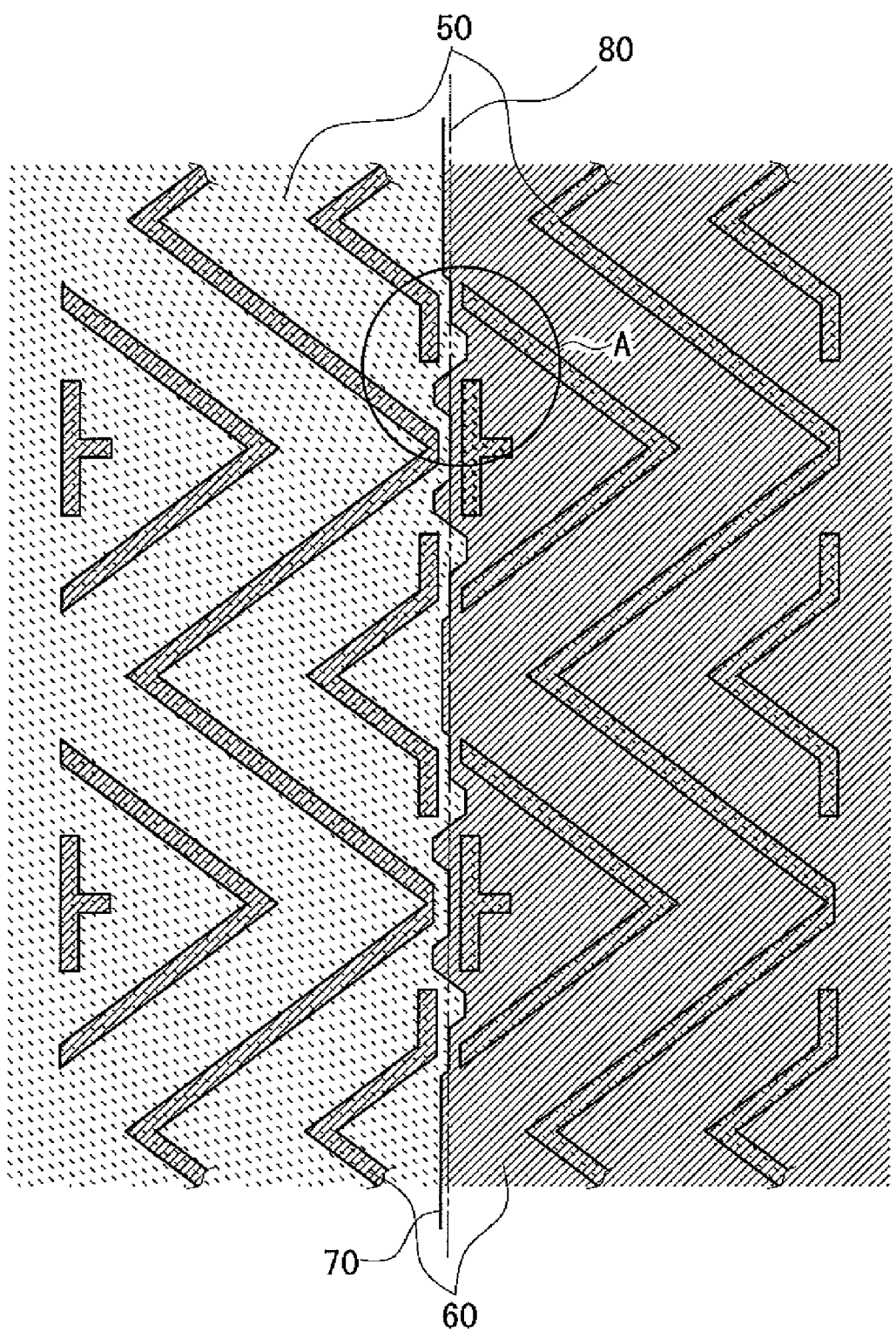
FIG. 3 is a plan view showing a state where two division masks used for divisional exposure are stitched.
Figure 4:
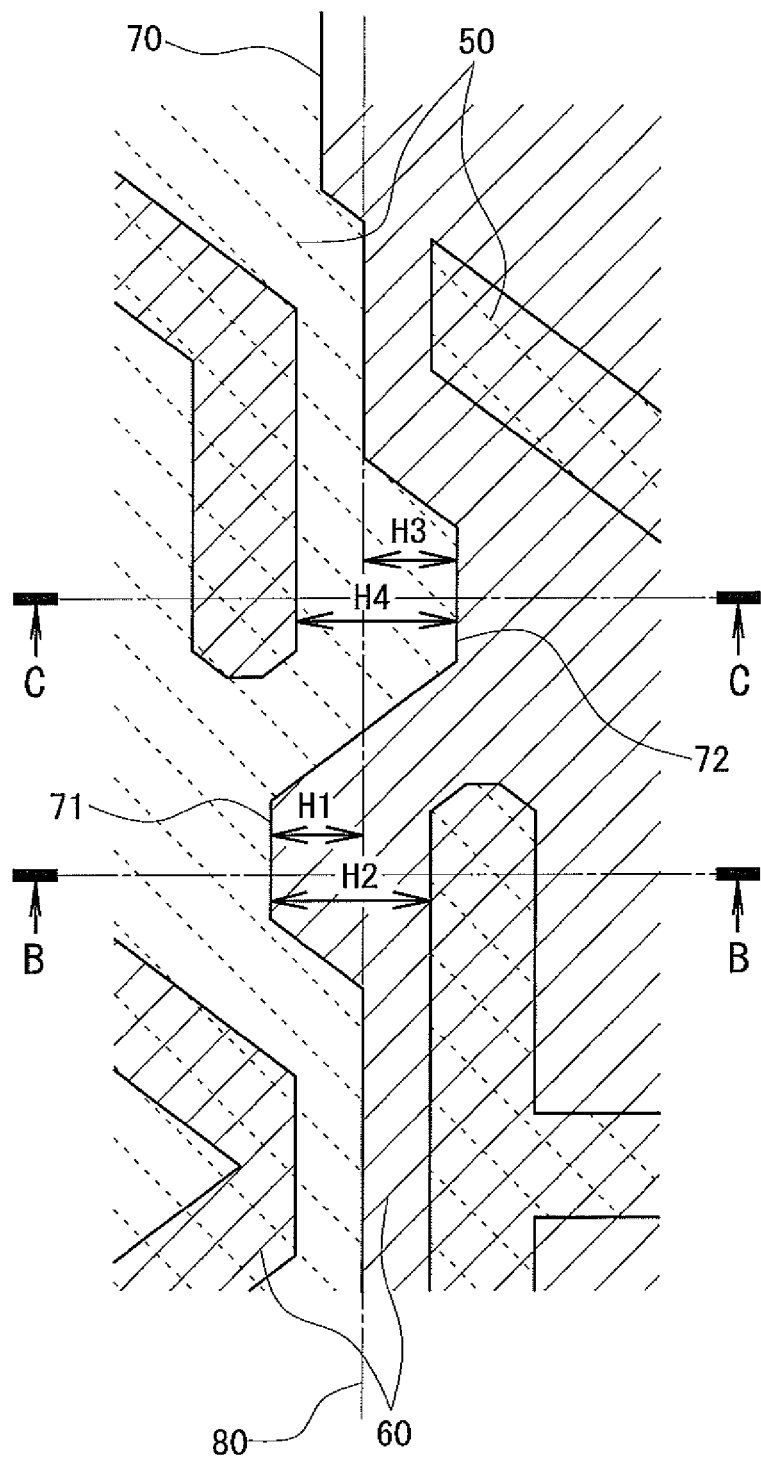
FIG. 4 is a magnified view of a circled portion A of FIG. 3.

A detailed description of a display device according to preferred embodiments of the present invention will now be given with reference to the accompanying drawings. FIG. 1 is a magnified schematic plan view showing two pixels adjacent to each other in a crystal liquid display device according to a preferred embodiment of the present invention. FIG. 2 is a schematic transverse sectional view of the pixels shown in FIG. 1. FIG. 3 is a plan view showing a state where two division masks used for divisional exposure are stitched. FIG. 4 is a magnified view of a circled portion A of FIG. 3.

As shown in the sectional view of FIG. 2, in the crystal liquid display device 1, a liquid crystal layer 40 including liquid crystal molecules aligned in a vertical direction is interposed between an opposed supporting substrate pair 10 and 30 (10: the substrate at an active element side, 30: the substrate at a color filter side), and on the supporting substrate 10 which is the lower one, pixel electrodes 17 are arranged in a matrix.

First, a description of the supporting substrate 10 (the substrate at the active element side) is provided. As shown in FIG. 1, on the periphery of each of the pixel electrodes 17, a pair of parallel gate bus lines 11 and a pair of parallel source bus lines 12 preferably made from aluminum or other suitable material are formed to be perpendicular or substantially perpendicular to each other. The gate bus lines and the source bus lines 12 cross each other so that the gate bus lines 11 are located lower than the source bus lines at the intersection portions thereof, and the gate bus lines and the source bus lines 12 are electrically insulated from each other at the intersection portions thereof.

At the lower-left intersection portion of the gate bus line 11 and the source bus line 12, an active element (thin film transistor) 13 as a switching element is provided, to which a gate electrode 11a that is a part of the gate bus line is connected.

The gate bus line 11 and the gate electrode 11a are preferably formed in one wiring layer (a first wiring layer). In other words, the gate bus line 11 and the gate electrode 11a are formed by patterning one conductive film. The gate bus line 11 and the gate electrode 11a are coated with a gate insulating film 14 preferably made from silicon nitride or other suitable material (see FIG. 2).

On the gate insulating film 14, an unillustrated semiconductor layer preferably made from amorphous silicon is formed to be integral with the active element 13 so as to overlay the gate electrode 11*a*. On the gate insulating film 14, a source electrode 13*a* and a drain electrode 13*b* are formed on opposite sides of the semiconductor layer on the gate electrode 11*a* so as to be spaced apart from each other. The source electrode 13*a* is connected to the source bus line 12, and the drain electrode 13*b* is connected to the pixel electrode 17 via a contact hole 15. This source bus line 12, the source electrode 13*a* and the drain electrode 13*b* are preferably formed in one wiring layer (a second wiring layer).

The source bus line 12 and the active element 13 are coated with an interlayer protective film 16 which is formed on the gate insulating film 14. The interlayer protective film 16 is interposed between the active element 13 and the first and second wiring layers (e.g., the gate bus line 11 and the source bus line 12), and the pixel electrode 17, and is used for insulating the electric conductors from each other (see FIG. 2).

On the interlayer protective film 16, one pixel electrode 17 is formed per pixel region. The pixel electrode 17 is preferably made from a transparent electric conductor such as an ITO (indium-tin oxide) material. The pixel electrode 17 is electrically connected to the drain electrode 13*b* of the active element 13 via the contact hole 15 formed in the interlayer protective film 16.

In the pixel electrode 17, an opening 18 of a slit is formed to extend in an oblique direction. The opening 18 is provided and arranged to improve the viewing angle characteristics as mentioned above. In this preferred embodiment, the opening 18 in the one pixel electrode 17 is preferably arranged to be symmetrical with respect to a horizontal center line of the pixel electrode 17.

On the pixel electrode 17, an upper alignment layer 21 is arranged to cover the surface of the pixel electrode 17. The upper alignment layer 21 is preferably made from a polyimide or other suitable material.

Next, a description of the supporting substrate 30 (the substrate at the color filter side) will be provided. As shown in FIG. 2, a black matrix 31 is provided beneath the supporting substrate 30. The black matrix 31 is arranged to shield from light an area at the supporting substrate 10 where the gate bus line 11, the source bus line 12 and the active element 13 are located. In addition, beneath the supporting substrate 30, a color filter 32 of any one of red (R), green (G) and blue (B) is provided to each of the pixel electrodes. In this embodiment, the color filters of R, G and B are repeatedly placed in this order in the row direction, and the filters of the same color are placed in the column direction.

Beneath the color filter 32, a common electrode 33 which is common with respect to the pixels is formed. This common electrode 33 is also preferably made from a transparent electric conductor such as an ITO material. Beneath the common electrode 33, a linear protrusion 34 is formed. As shown in FIG. 1, the linear protrusion 34 is located in the center positions between lines of the opening 18 provided to the electrode 17 in the supporting substrate 10 (the substrate at the active element side). The linear protrusion 34 is provided and arranged to improve the viewing angle characteristics by controlling the liquid crystal molecules to be aligned in predetermined inclined directions relative to the vertical direction. A method for forming the linear protrusion 34 by divisional exposure will be described later.

The linear protrusion 34 includes main ribs 34*a* extending in the oblique direction which are located within a plane of the pixel electrode 17, and branch ribs 34*b* extending in the column direction which are located between the adjacent pixel electrodes 17. The main ribs 34*a* are provided and arranged to control the alignment of the liquid crystal molecules on the pixel electrode 17, and the branch ribs 34*b* are provided and arranged to control the alignment of the liquid crystal molecules between the pixel electrodes 17. Without the branch ribs 34*b*, poor alignment of the liquid crystal molecules between the pixel electrodes 17 is caused, resulting in unevenness to occur.

Meanwhile, on the pixel electrode 17, an upper alignment layer 35 is arranged to cover the surfaces of the common electrode 33 and the linear protrusion 34. The upper alignment layer 35 is preferably made from a polyimide or other suitable material.

Between the supporting substrate 10 (the substrate at the active element side) and the supporting substrate 30 (the substrate at the color filter side), the liquid crystal layer 40 possessing negative dielectric anisotropy is interposed. Spacers such as the spherical ones or the columnar ones having the same size (not shown) are located between the substrates to uniformly maintain a gap (cell gap) therebetween. In addition, polarizers (not shown) are located respectively beneath the supporting substrate 10 and on the supporting substrate 30.

Next, the formation of the linear protrusion 34 by divisional exposure, which is one of the unique features of the present preferred embodiment of the present invention, is explained referring to FIGS. 3 to 6B. In FIG. 3, a state where the two division masks 50 and 60 used for divisional exposure are stitched is shown. In FIG. 4, the magnified view of the circled portion A of FIG. 3 is shown.

As illustrated in FIG. 3, a boundary 70 for divisional exposure that is a stitching portion of the division masks 50 and 60 preferably has a zigzag configuration. The chain single-dashed line in the middle of FIG. 3 indicates the divisional boundary 80 explained in the Description of the Related Art above. The divisional boundary 70 according to a preferred embodiment of the present invention has bent portions 71 and 72 that extend into the adjacent divided regions at predetermined distances in the vicinity of the linear protrusion 34, especially in the vicinities of the branch ribs 34*b* (see FIG. 4).

Figure 5A:
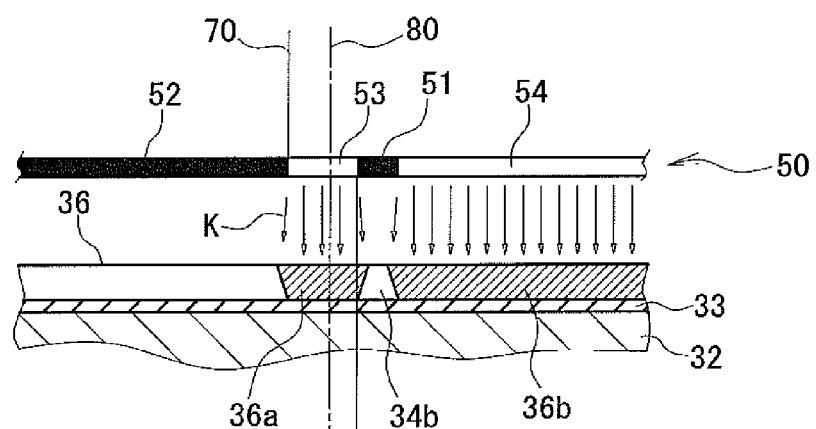
FIGS. 5A and 5B are sectional views showing states at a section B-B in FIG. 4 in the course of divisional exposure using the division mask 50 and the division mask 60 in this order.
Figure 5B:
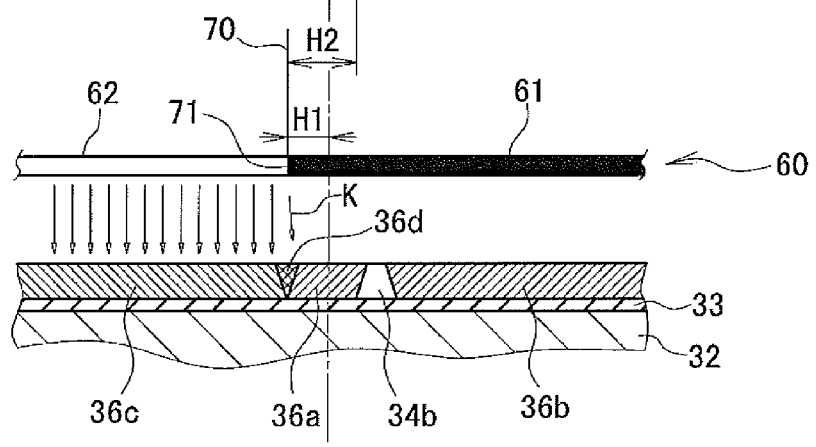

FIGS. 5A and 5B are sectional views showing states at a section B-B in FIG. 4 in the course of divisional exposure using the division masks 50 and 60 in this order. First, as shown in FIG. 5A, an organic insulating film 36 that is a positive photoresist, which is coated on the common electrode, to be subjected to a pre-baking process, is subjected to an exposure process using the division mask 50. The division mask 50 includes an opaque pattern 51 for patterning the branch ribs 34*b* on the right side of the divisional boundary 70 and an opaque pattern 52 on the left side of the divisional boundary 70, and transparent patterns 53 and 54. As illustrated, the transparent patterns 53 and 54 provide diffraction light K, which forms exposed portions 36*a* and 36*b* in the form of an inverted trapezoid in the organic insulating film 36.

Next, an exposure process using the division mask 60 is performed as shown in FIG. 5B. The division mask 60 includes an opaque pattern 61 for shielding the branch ribs 34*a* on the right side of the divisional boundary 70 from the light, and a transparent pattern 62 on the left side of the divisional boundary 70. Also in this case, the transparent pattern 62 provides the diffraction light K, which forms an exposed portion 36*c* in the form of an inverted trapezoid in the organic insulating film 36. In this instance, a portion 36*d* at the divisional boundary 70 in the organic insulating film 36 is double exposed.

Figures 9A, 9B, 9C, 9D:
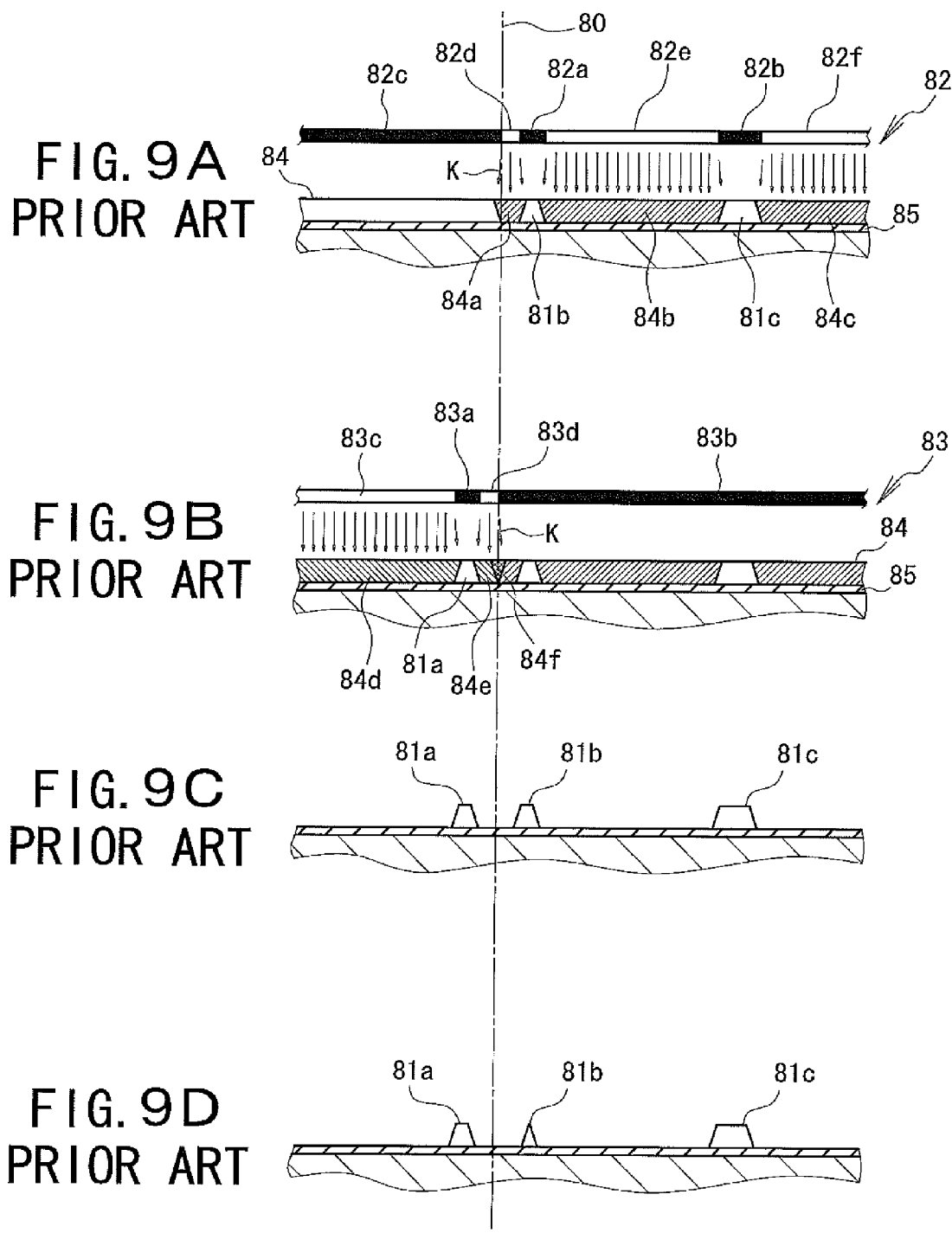
FIGS. 9A to 9D are sectional views showing states at a section E-E in FIG. 7 in the course of divisional exposure using the division mask 82 and the division mask 83 in this order.

Since a left end of the opaque pattern 61 (the divisional boundary 70) of the division mask 60 is positioned at the left of a left end of the opaque pattern 83*b* (the divisional boundary 80) shown in FIG. 9B explained in the Related Art at a length H1 of the bending portion 71, the double exposed portion 36d is formed in a position adequately apart from the branch ribs 34b. Therefore, even if exposure displacement is caused by an error in stitching the division masks 50 and 60, the branch ribs 34b are prevented from becoming thin or disappearing because of the double exposure. Incidentally, it is preferable to set a distance H2 from a left end of the branch rib 34b to the left end of the opaque pattern 61 as illustrated to be longer than at least the sum of a dimensional deviation in exposure displacement and a range of the diffraction light.

Figure 6A:
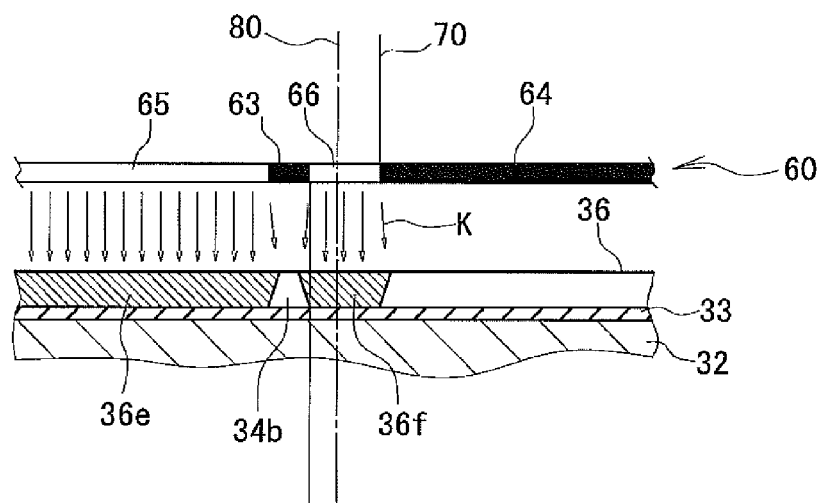
FIGS. 6A and 6B are sectional views showing states at a section C-C in FIG. 4 in the course of divisional exposure using the division mask 60 and the division mask 50 in this order.
Figure 6B:
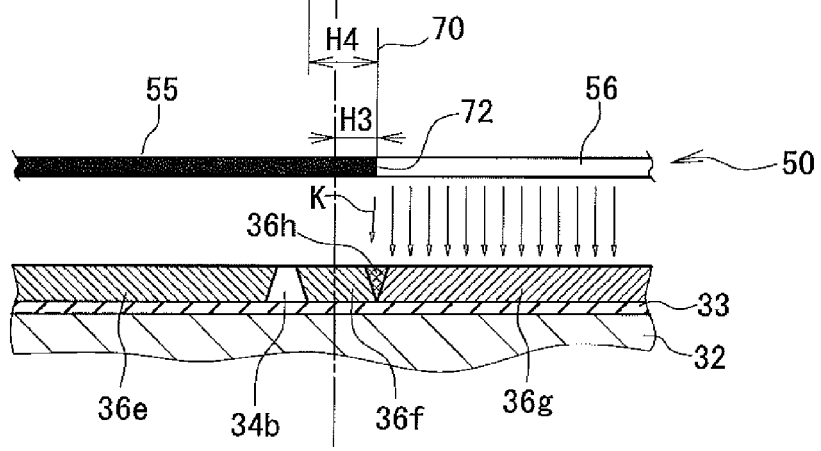
Figure 7:
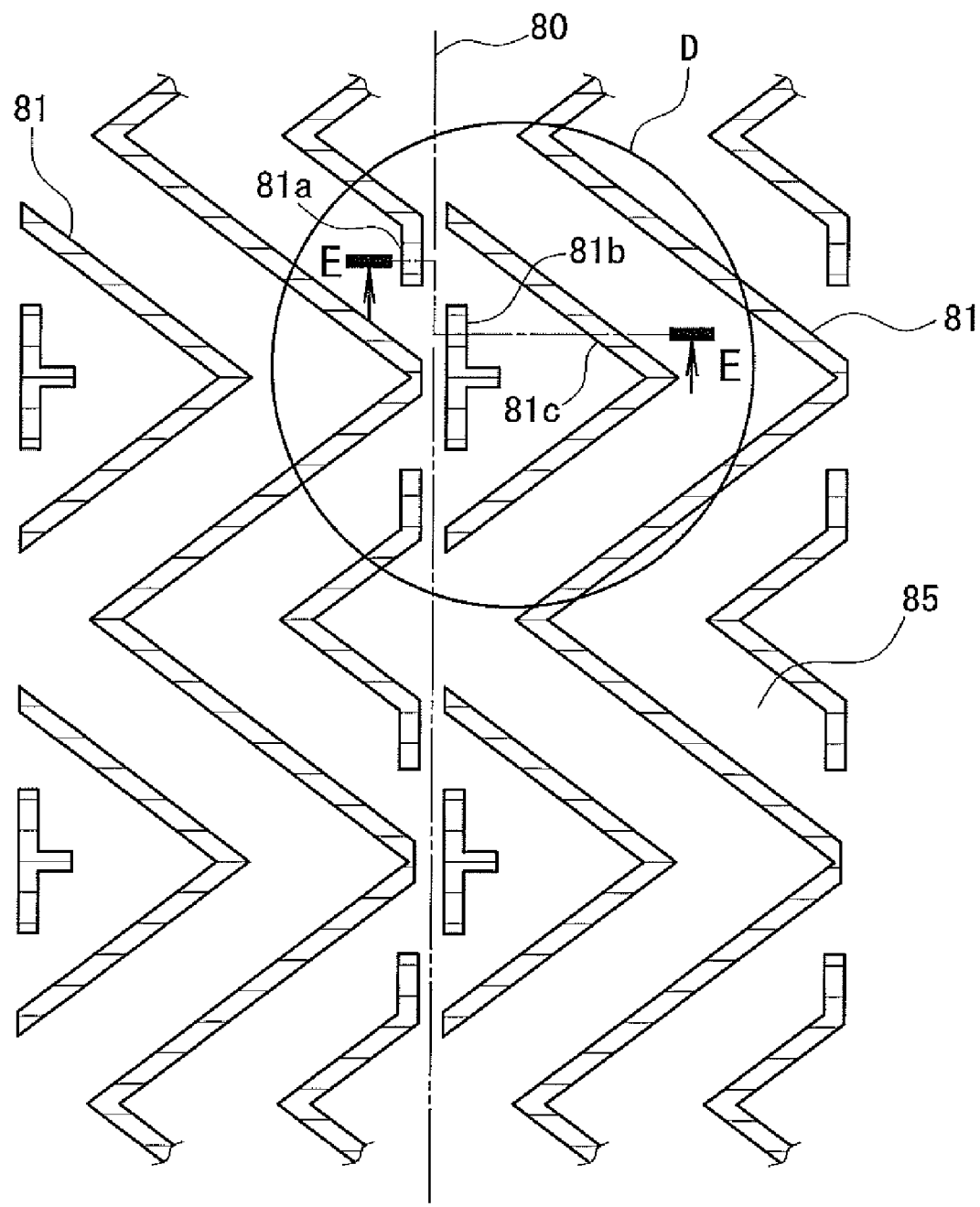
FIG. 7 is a plan view showing linear protrusions in two pixels adjacent to each other, which are conventionally used as a control mechanism to achieve liquid crystal molecule alignment.
Figure 8A:
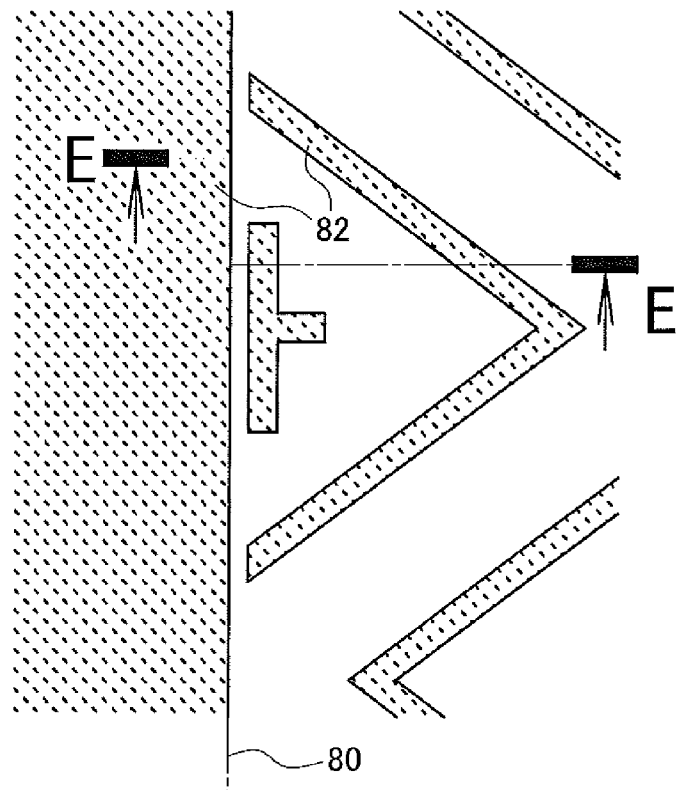
FIGS. 8A and 8B are magnified views showing two division masks 82 and 83 used for divisional exposure for forming the linear protrusions in a circled portion D of FIG. 7.
Figure 8B:
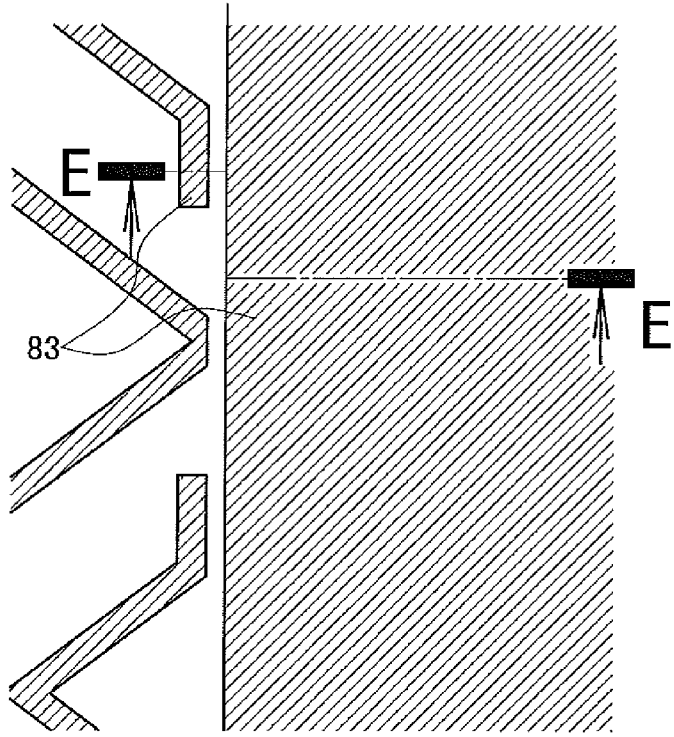

FIGS. 6A and 6B are sectional views showing states at a section C-C in FIG. 4 in the course of divisional exposure using the division masks 60 and 50 in this order. First, as shown in FIG. 6A, the organic insulating film 36, which is coated on the common electrode to be subjected to the pre-baking process, is subjected to an exposure process using the division mask 60. The division mask 60 includes an opaque pattern 63 for patterning the branch ribs 34b on the left side of the divisional boundary 70 and an opaque pattern 64 on the right side of the divisional boundary 70, and transparent patterns 65 and 66. As illustrated, the transparent patterns 65 and 66 provide the diffraction light K, which forms exposed portions 36e and 36f in the form of an inverted trapezoid in the organic insulating film 36.

Next, an exposure process using the division mask 50 is performed as shown in FIG. 6B. The division mask 50 includes an opaque pattern 55 for shielding the branch ribs 34a on the left side of the divisional boundary 70 from the light, and a transparent pattern 56 on the right side of the divisional boundary 70. Also in this case, the transparent pattern 56 provides the diffraction light K, which forms an exposed portion 36g in the form of an inverted trapezoid in the organic insulating film 36. In this instance, a portion 36h at the divisional boundary 70 in the organic insulating film 36 is double exposed.

Since a right end of the opaque pattern 55 of the division mask 50 is positioned at the right at a length H3 of the bending portion 72, the double exposed portion 36h is formed in a position adequately apart from the branch ribs 34b, in this case too. Therefore, even if exposure displacement is caused by an error in stitching the division masks 60 and 50, the branch ribs 34b are prevented from becoming thin or disappearing because of the double exposure. Incidentally, it is preferable to set a distance H4 from a right end of the branch rib 34b to the right end of the opaque pattern 55 as illustrated to be longer than at least the sum of a dimensional deviation in exposure displacement and a range of the diffraction light.

The foregoing description of preferred embodiments of the invention has been presented for purposes of illustration and description. However, it is not intended to limit the present invention to the preferred embodiments described herein, and modifications and variations are possible as long as they do not deviate from the principles of the invention. The colors of the color filter maybe three colors of Y (yellow), M (magenta) and C (cyan), or four colors including W (white) in addition to the three colors of RGB, and the order of the colors is not limited to the one in the above-described preferred embodiment. In addition, the present invention can be applied to a configuration in which a linear protrusion is provided to a supporting substrate at an active element side, and is not limited to a configuration such that a linear protrusion is provided to a supporting substrate at a color filter side as in the above-described preferred embodiments.

Further, the present invention is not limited to a liquid crystal display device, and can be also applied to an ordinary display device which has an insulating substrate on which a plurality of dots are arranged in a matrix, and can be preferably embodied in formation of various linear protrusions on an insulating substrate by divisional exposure.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A production process of a display device including an insulating substrate on which a plurality of dots is arranged in a matrix, the production process comprising the step of:
    forming linear protrusions on the insulating substrate by performing a divisional exposure process on a plurality of divided regions on the insulating substrate such that the linear protrusions are arranged to directly align liquid crystal molecules in a liquid crystal layer located on the insulating substrate; wherein
    a boundary between adjacent ones of the plurality of divided regions includes, in a vicinity of one of the linear protrusions that is in one of the divided regions, at least one bent portion that extends into at least a portion of another one of the plurality of divided regions, and is arranged to prevent the one of the linear protrusions in a vicinity of the boundary from becoming thin or disappearing because of double exposure occurring in the divisional exposure process.

2. The production process according to claim 1, wherein the insulating substrate includes a color filter.

3. A display device having an insulating substrate on which a plurality of dots are arranged in a matrix, the display device comprising:
    linear protrusions that are disposed in a plurality of divisionally exposed divided regions on the insulating substrate, and arranged to directly align liquid crystal molecules in a liquid crystal layer located on the insulating substrate; wherein
    a boundary between adjacent ones of the plurality of divisionally exposed divided regions includes, in a vicinity of one of the linear protrusions that is in one of the divided regions, at least one bent portion that extends into at least a portion of another one of the plurality of divided regions, and is arranged to prevent the one of the linear protrusions in a vicinity of the boundary from becoming thin or disappearing because of double exposure occurring in a divisional exposure process used to form the plurality of divisionally exposed divided regions.

4. The display device according to claim 3, wherein the insulating substrate includes a color filter.

* * * * *